(12) United States Patent
Lukin et al.

(10) Patent No.: US 10,767,255 B2
(45) Date of Patent: Sep. 8, 2020

(54) DEVICE AND METHOD OF EVAPORATING A MATERIAL FROM A METAL MELT

(71) Applicant: Freiberger Compound Materials GMBH, Freiberg (DE)

(72) Inventors: Gleb Lukin, Chemnitz (DE); Olf Pätzold, Frauenstein (DE); Michael Stelter, Wegefarth (DE)

(73) Assignee: Freiberger Compound Materials GmbH, Freiberger (DE)

( * ) Notice: Subject to any disclaimer, the term of this patent is extended or adjusted under 35 U.S.C. 154(b) by 249 days.

(21) Appl. No.: 13/721,086

(22) Filed: Dec. 20, 2012

(65) Prior Publication Data

US 2013/0163967 A1    Jun. 27, 2013

Related U.S. Application Data

(60) Provisional application No. 61/578,578, filed on Dec. 21, 2011.

(30) Foreign Application Priority Data

Dec. 21, 2011    (DE) .................. 10 2011 089 501

(51) Int. Cl.
    *C23C 14/26* (2006.01)
    *C23C 14/22* (2006.01)
    *C23C 14/24* (2006.01)

(52) U.S. Cl.
    CPC ............ *C23C 14/26* (2013.01); *C23C 14/228* (2013.01); *C23C 14/243* (2013.01); *C23C 14/246* (2013.01)

(58) Field of Classification Search
    CPC ... C23C 14/228; C23C 14/243; C23C 14/246; C23C 14/26; H05B 6/105
    (Continued)

(56) References Cited

U.S. PATENT DOCUMENTS 3,716,345 A * 2/1973 Grabmaier .................. 117/31
3,980,438 A * 9/1976 Castonguay et al. ......... 117/202
(Continued)

FOREIGN PATENT DOCUMENTS

| EP | 1967604 | 9/2008 |
| JP | 58197270 | 11/1983 |
| JP | 2005336558 | 12/2005 |

OTHER PUBLICATIONS

Japanese to English machine translation of JP-2005336558.*
(Continued)

*Primary Examiner* — Michael G Hoang
(74) *Attorney, Agent, or Firm* — A.C. Entis-IP Ltd.; Allan C. Entis; Kenichi N. Hartman

(57) ABSTRACT

A device for evaporating a metal melt, the device comprising a first crucible or crucible portion operative to receive the metal melt comprising at least one aperture, from which the evaporated metal may pass off, a second crucible or crucible portion operative to receive a susceptor material, comprising an electromagnetic radiation source, which is arranged such that it can heat susceptor material comprised in the second crucible or crucible portion through incident electromagnetic induction, wherein it does not or only negligibly heats the metal melt in the first crucible or crucible portion, wherein the first crucible or crucible portion and the second crucible or crucible portion are thermally coupled, such that the metal melt can attain a desired temperature.

20 Claims, 5 Drawing Sheets

(58) Field of Classification Search
USPC .......................... 392/389; 118/726; 219/634
See application file for complete search history.

(56) References Cited

U.S. PATENT DOCUMENTS

| | | | | |
|---|---|---|---|---|
| 3,998,264 | A * | 12/1976 | Hocking | 164/513 |
| 4,036,595 | A * | 7/1977 | Lorenzini | C30B 15/02 117/202 |
| 4,055,391 | A * | 10/1977 | Schmidt et al. | 117/217 |
| 4,125,086 | A | 11/1978 | Vig et al. | |
| 4,246,064 | A * | 1/1981 | Dewees | C30B 15/12 117/31 |
| 4,352,784 | A * | 10/1982 | Lin | C30B 15/12 117/213 |
| 4,791,261 | A | 12/1988 | Phinney et al. | |
| 5,820,649 | A * | 10/1998 | Ogure | C30B 15/002 65/66 |
| 6,279,352 | B1 * | 8/2001 | Trentelman | C03B 37/023 219/552 |
| 6,550,279 | B1 * | 4/2003 | Anderson | C03B 37/023 65/377 |
| 6,588,235 | B2 * | 7/2003 | Trentelman | C03B 37/023 65/377 |
| 7,691,199 | B2 * | 4/2010 | Holder | C30B 15/02 117/214 |
| 7,862,656 | B2 * | 1/2011 | Radkevich | C30B 15/12 117/13 |
| 2002/0056411 | A1 * | 5/2002 | Hara | C30B 25/00 117/13 |
| 2002/0079121 | A1 * | 6/2002 | Ryan | C09D 167/00 174/68.1 |
| 2003/0041788 | A1 * | 3/2003 | Mikajiri et al. | 110/235 |
| 2004/0250747 | A1 * | 12/2004 | Sasaki | C30B 23/02 117/2 |
| 2006/0096977 | A1 * | 5/2006 | Ripley | H05B 6/6494 219/690 |
| 2008/0072817 | A1 * | 3/2008 | Zwieback | C30B 23/00 117/84 |
| 2012/0060748 | A1 * | 3/2012 | Corbeil | C30B 35/005 117/23 |

OTHER PUBLICATIONS

Kuzmichev et al; Evaporators with Induction Heating and Their Applications; Advances in Induction and Microwave Heating of Mineral and Organic Materials, 2011, pp. 269-302.
Vodakov et al; High rate GaN epitaxial growth by sublimation sandwich method; Journal of Crystal Growth; 183 (1998) pp. 10-14.
Berkman; Growth of GaN from Elemental Gallium and Ammonia via a Modified Sandwich Growth Technique; PhD Thesis, North Carolina State University; 2005.
Imade et al; Homoepitaxial growth of GaN single crystals using gallium hydride; Materials Letters 59 (2005) pp. 4026-4029.
Wu et al; Bulk GaN growth by Gallium Vapor Transport technique; phys. stat. sol. (c) 2, No. 7, pp. 2032-2035 (2005).
Siche et al; Growth of GaN crystals from chlorine-free gas phase; Journal of Crystal Growth; 310 (2008) pp. 916-919.
Ames et al; Crucible Type Evaporation Source for Aluminum; AIP Review of Scientific Instruments; 37, 1737 (1966); pp. 1737-1738.
Kuzmichev et al; Evaporators with induction heating and their applications; Przeglad elektrotechniczny; No/vol:Mar. 2008.
Fujito et al; Bulk GaN crystals grown by Hvpe; Journal of Crystal Growth, 311 (10), 2009, pp. 3011-3014.
Baranov et al; Current status of GaN crystal growth by sublimation sandwich technique; M R S Internet Journal Nitride Semiconductor Research; 3, 50 (1998); pp. 1-17.
Kaminski et al; Growth and structural properties of thick GaN layers obtained by sublimation sandwich method; Journal of Crystal Growth 303 (2007) 395-399.
Shin et al; High temperature nucleation and growth of GaNcrystals from the vapor phase; Journal of Crystal Growth 241 (2002) pp. 404-415.
Rost et al; The role of carbon in transport processes during PVT growth of bulk GaN; Phys. Status Solidi C 6, No. 6, 1484-1487 (2009).
Rost et al; Growth of single crystalline GaN from chlorine-free gas phase; phys. stat. sol. (c) 5, No. 6, 1543-1546 (2008).
Office Action dated Aug. 14, 2012 of corresponding German Patent Application No. 0 2011 089501.9; Applicant: Freiberger Compound Materials GmbH.
International Search Report dated Feb. 2, 2013 of corresponding PCT Application PCT/EP2012/073677, International filed Nov. 27, 2012.
Mahan et al; Physical vapor deposition of thin films, 2000, pp. 143-144.
Shah Ismat S. et al, Evaporation: Processes, Bulk Microstructures, and Mechanical Properties, 2010, pp. 135-249.

* cited by examiner

DEVICE AND METHOD OF EVAPORATING A MATERIAL FROM A METAL MELT

RELATED APPLICATIONS

The present application claims the benefit under 35 U.S.C. § 119(e) of U.S. Provisional Application 61/578,578 filed on Dec. 21, 2011 and claims the benefit under 35 U.S.C. § 119(a)-(d) of German Patent Application 102011089501.9 filed on Dec. 21, 2011, the disclosures of which are incorporated herein by reference.

TECHNICAL FIELD

Embodiments relate to the evaporation of material from a metal melt.

BACKGROUND

The thermal evaporation of metallic melts includes a broad industrial application spectrum, which ranges from the manufacturing of functional coatings up to the material synthesis from the gaseous phase (S. Shah et al., "Evaporation: Processes, bulk micro-structures and mechanical properties", in: "Handbook of Deposition Technologies for Films and Coatings", ed. P. Martin, pp. 135-252, William Andrew, Oxford, 2010, ISBN 978-0-8155-2031-3).

By inductively heating the melt, temperatures larger than 2.000° C. can be obtained, cf. A. Kuzmichev, L. Tsybulsky, "*Evaporators with Induction Heating and their Applications*" in: "Advances in Induction and Microwave Heating of Mineral and Organic Materials", ed. S. Grundas, pp. 269-302, InTec, Rijeka, Croatia, 2011, ISBN 978-953-307-522-8, wherein large evaporation rates can be achieved. Even with regard to metals having low vapour pressure, such as for example gallium, an efficient thermal evaporation can be guaranteed by inductive heating, see J. E. Mahan, "Physical Vapor Deposition of Thin Films", pp. 143-144, Wiley, 2000, ISBN 0-471-33001-9.

Evaporation devices are predominantly employed under high vacuum conditions (S. Shah et al, l.c., A. Kuzmichev et al. (2011), l.c.), wherein the molecular flow represents the dominating transport mechanism for the evaporated species. In some methods for manufacturing compound semiconductors, the evaporation is carried out in a coarse vacuum and the transport is effected in the gaseous phase by convection and diffusion (cf.: Yu. A. Vodakov et al., "*High Rate GaN Epitaxial Growth by Sublimations Sandwich Method*", J. Crys. Growth 183 (1998) 10; E. Berkman, PhD Thesis, North Carolina State University, 2005; M. Imade et al., Mat. Lett. 59 (2005) 4026; H. Wu et al., phys. Stat. sol. (c) 7 (2005) 2032; D. Siche et al., J. Crys. Growth 310 (2008) 916.

The inductor can directly be positioned at the melting crucible (cf.: I. Ames et al., "*Crucible Type Evaporation Source for Aluminum*", Rev. Sci. Instr., 37 (1966) 1737; R. R. Phinney, D. C. Strippe, "*Crucible for Evaporation of Metallic Film*", U.S. Pat. No. 4,791,261; A. Kuzmichev, L. Tsybulsky, "*Evaporators with Induction Heating and their Applications*", Przeglad elektrotechniczny, 84 (2008) 32).

Criteria for the selection of susceptor substances are a high melting point, a high electrical conductivity, a high resistance regarding temperature changes and an inert characteristic with respect to the melt and with respect to the gaseous atmosphere present in the specific application. A preferred substance for a susceptor is graphite (R. R. Phinney et al., l.c.; A. Kuzmichev et al. (2008), l.c.), in some instances also conductive special-ceramics (I. Ames et al., l.c.) or molybdenum (R. R. Phinney et al., l.c.) are used.

SUMMARY

Embodiments relate to a device for evaporating material from a metal melt. In embodiments, the device comprises a first crucible or crucible portion that is thermally coupled with a second crucible and crucible portion. The first crucible or crucible portion is operative to receive a metal melt, and the second crucible and crucible portion is operative to receive a susceptor material.

The first crucible or crucible portion is positioned relative to a second crucible or crucible portion such that when the second crucible or crucible contains a susceptor material, the susceptor material substantially shields the first crucible or crucible portion from electromagnetic radiation heating the susceptor material.

In embodiments, the susceptor material in the second crucible or crucible portion shields the first crucible or crucible portion completely from electromagnetic radiation heating the susceptor material.

In embodiments, the susceptor material in the second crucible or crucible portion shields the first crucible or crucible portion only partially from electromagnetic radiation heating the susceptor material.

In embodiments, the first crucible or crucible portion and the second crucible or crucible portion share a common crucible wall.

In embodiments, the susceptor material is a metal melt.

In embodiments, the metal melt and the susceptor material include the same or a similar material.

In embodiments, the metal melt and the susceptor are composed of material or a combination of at least two materials selected from a group consisting of: gallium, indium and aluminium.

In embodiments, the content of each of the first crucible or crucible portion and the second crucible or crucible portion are in communication with each other via a connection selected from a group consisting of: a conduit or an opening in a common separation wall.

In embodiments, the connection between the first crucible or crucible portion and the second crucible or crucible portion is formed in the manner of a siphon.

In embodiments, the first crucible or crucible portion is formed substantially cylindrical, hollow-cylindrical or at least as one or more corresponding segments, and wherein the second crucible or crucible portion encloses the first crucible or crucible portion at least like a cylinder shell.

In embodiments, the device comprises a thermal element, which is provided in the first crucible or crucible portion and operative to detect the temperature in the first crucible or crucible portion.

In embodiments, the device comprises a replenishment element that is configured to replenish the first crucible or crucible portion with material of the metal melt.

In embodiments, the device comprises a replenishment element that is configured to replenish the first or second crucible or crucible portion with material of the metal melt.

In embodiments, the first crucible or crucible portion is made from a dielectric material.

In embodiments, the second crucible or crucible portion is formed from a dielectric material.

In embodiments, the substantially cylindrically or hollow-cylindrically sections that form first crucible or crucible portion comprises an inner channel along its longitudinal axis, towards which the at least one opening extends.

In embodiments, there is further provided an arrangement for forming a flow of a carrier gas directed through the inner channel.

In embodiments, the inner channel opens at one end, in the flow direction, in the form of a funnel.

A method for evaporating a material from a metal melt is provided. In embodiments, the method comprises providing a susceptor material in a second crucible or crucible portion; heating the susceptor material by electrical induction; providing a metal melt in a first crucible or crucible portion being thermally coupled with the second crucible or crucible portion; transferring the heat from the susceptor material in the second crucible or crucible portion to the metal melt in the first crucible or crucible portion via thermal coupling, such that the metal melt reaches a desired temperature; evaporating the metal melt in the first crucible or crucible portion at the desired temperature.

In embodiments, the method comprises the same material for the metal melt and the susceptor material.

In embodiments, the method comprises connecting the metal melt and the susceptor material are with each other via an opening or a conduit between the crucibles or crucible portions, such that the heat transfer is additionally effected by an effect or a combination of at least two effects selected from a group of effects consisting of: convection, diffusion and direct heat transfer.

In embodiments, evaporating comprises dispensing of evaporated material from the metal melt in the first crucible or crucible portion via one or more apertures into the inner channel In embodiments, the step of evaporating comprises dispensing of evaporated material from the metal melt in the first crucible or crucible portion via one or more apertures into the inner channel, when the first crucible or crucible portion encloses an inner channel.

In embodiments, the method comprises supplying a flow of a carrier gas into the inner channel for carrying the evaporated material.

This summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE FIGURES

Non-limiting examples of embodiments are described below with reference to figures attached hereto that are listed following this paragraph. Identical structures, elements or parts that appear in more than one figure are generally labeled with a same numeral in all the figures in which they appear, and a numeral labeling an icon representing a given feature in a figure may be used to reference the given feature. Dimensions of components and features shown in the figures are chosen for convenience and clarity of presentation and are not necessarily shown to scale.

DESCRIPTION

Figure 1:
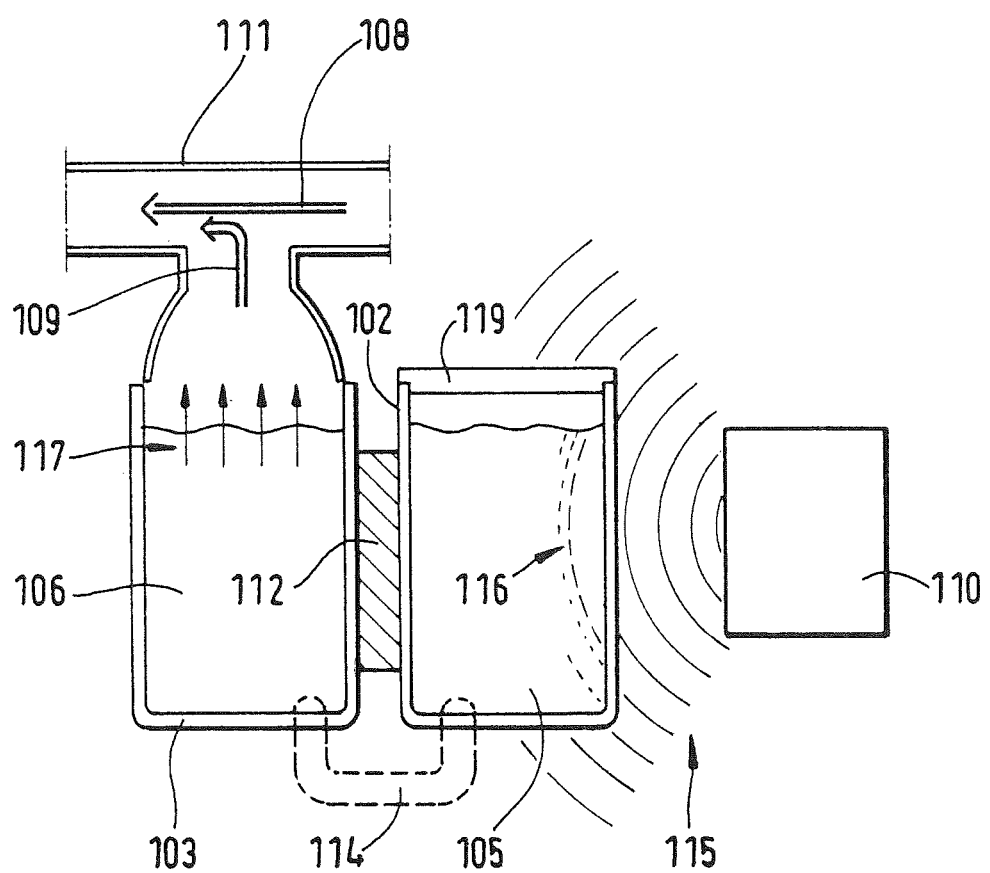
FIG. 1 schematically shows a first embodiment of a device for evaporating a metal melt.

It is an object of embodiments of the invention to offer an improved method as well as the corresponding device for the evaporation of a metal melt.

Embodiments relate to an inductively heated device for thermally evaporating a material from a melt which has a relatively high electrical conductivity (in the following denoted as a metal melt or a metallic melt) as well as to a corresponding method. The device can be used as a source of substances for manufacturing coatings or materials in a broad interval of pressures ranging from relatively high vacuum up to atmospheric pressure. The material of the metal melt can include relatively low-temperature melting metals such as gallium, indium, aluminum or mixtures thereof.

According to an embodiment of the invention, the device comprises a first crucible or crucible portion as well as a second crucible or crucible portion. A first crucible or crucible portion is provided to receive the metal melt to be evaporated, the second crucible or crucible portion is provided to receive a susceptor material. The first crucible or crucible portion and the second crucible or crucible portion define inner spaces, which are spatially distinct from each other—one space for receiving the metal melt and the other space for receiving the susceptor material. According embodiments, these inner spaces are separate from each other or mutually connected with each other (for example by a siphon).

The expression "crucible" is to be understood herein as a discrete container, while the expression "crucible portion" denotes a crucible-like or container-like portion of an arrangement, which may comprise a plurality of associated components and/or walls. In particular, according to this aspect, such an arrangement may comprise two or more associated crucible portions.

A metal melt can relate to a melt of an arbitrary material such as a metal. A crucible or a crucible portion (or a plurality of crucibles or crucible portions) may for example be operative to receive or contain melts composed of a material or a combination of at least two materials selected from a group consisting of: gallium, indium and aluminium. The crucible or the crucible portion (or a plurality of crucibles or crucible portions) may thus meet the requirements relating to chemical resistance, heat resistance, and/or mechanical resistance with regard to the material to be received.

The susceptor material includes the characteristic to transform incident electromagnetic radiation into heat via induction. Therefore, the susceptor material is the molten phase of the same or at least a similar material as that of the metal melt to be evaporated.

The electromagnetic radiation to be transformed into heat via induction is generated by an electromagnetic radiation source denoted as such in view of this effect. The electromagnetic radiation to be generated by the source may be a radio- and/or microwave frequency radiation selected for the present purpose and adapted to the susceptor material, the radiation ranging between frequencies of, for example, 0.1 kHz and 300 GHz. Other wavelength ranges, particularly those adjacent to the given frequency range, are not to be construed as excluded according to embodiments.

The electromagnetic radiation source is arranged with respect to the first crucible or crucible portion and the second crucible or crucible portion, such that the susceptor material provided in the second crucible or crucible portion is heated due to electromagnetic induction, while the metal melt provided in the first crucible or crucible portion is not or only insignificantly heated. Herein "insignificant" means, that a direct heating of the metal melt due to the electromagnetic induction by the electromagnetic radiation source is not sufficient, in order to achieve or at least maintain the evaporation process.

One effect of this arrangement may thus be found in that the first crucible or crucible portion (more precisely: the metal melt contained therein) is substantially shielded by the second crucible or crucible portion, or more precisely: by the susceptor material contained therein) or by other means from the incident electromagnetic radiation or induction. The mutual arrangement of the crucibles and the crucible portions, respectively, with respect to the electromagnetic radiation source thereby plays a role as well as the effect, that the electromagnetic radiation employed inherently has only a relatively limited penetration depth.

The heat supply necessary for the evaporation is accomplished via a thermal coupling between the first and second crucibles or crucible portions, respectively.

It has been found that due to the thermal coupling, sputtering of the metal melt at its surface, which would be present if the metal melt was directly heated by magnetic induction, can be substantially avoided.

In an embodiment a melt comprises material or a combination of at least two materials selected from a group consisting of: gallium, indium and aluminium melt, undesired formation of droplets can at least be reduced if not even completely be substantially avoided.

In the method according to embodiments of the invention, a susceptor material is provided in a second crucible or crucible portion and heat is supplied via inductive heating of the susceptor material. Further, a metal melt or a corresponding not yet melted starting material is provided in a first crucible or a crucible portion thermally coupled with the second crucible or crucible portion. The heat is transferred via thermal coupling from the suspector material in the second crucible or crucible portion onto the metal melt in the first crucible or crucible portion, such that the metal melt reaches the desired temperature. The metal melt in the first crucible or crucible portion is evaporated at the desired temperature.

In the following, the invention is explained in more detail in conjunction with various embodiments.

Reference is now made to FIG. 1 which schematically shows a first embodiment of a device for evaporating a metal melt. The device comprises a first crucible 103 as well as a second crucible 102. Further, an electromagnetic radiation source 110 for inductively heating and melting of the material positioned in the second crucible 102 (for example a powder) is provided, so that a melt 105 can be formed. The material may include an arbitrary metal. Mixtures containing metals or metallic compounds are also comprised by the term "metal". The material of the melt 105 may according to an embodiment also include relatively low-temperature melting metals such as gallium, indium, aluminium, or mixtures thereof.

The heating is effected, in this non-limiting example, by an electromagnetic radiation 115, wherein the electromagnetic radiation source 110 may for example comprise a high frequency coil generating the radiation. The radiation, or its wavelength, or its wavelength spectrum, respectively, is selected depending on the material of the metal melt 105, such that it is heated via electromagnetic induction. The metal melt 105 herein correspondingly functions as the susceptor material. The induction power can be adjusted by controlling the electromagnetic radiation source 110. The maximum power hereby should be sufficient to melt the metal material.

The crucible can for example be made from a non-conductive, thermally and chemically resistant material such as for example pyrolytically deposited boron nitride (pBN) and/or other suitable materials, and is in this embodiment covered by a lid 119 in order to avoid a loss of the evaporating metal gas.

The first crucible 103 and the second crucible 102 are thermally coupled via a heat coupling 112. The heat coupling 112 may be a material having a relatively high heat conductivity, such that a melt 106, which is provided in the first crucible 103 and which for example comprises the same or a similar material as in that of the melt 105, such as similar low-temperature melting metals including, for example, gallium, indium, aluminium or mixtures thereof, is brought to almost the same temperature, which the metal melt 105 in the second crucible 102 has.

On the other hand, there is no or only a negligible direct heat input of the electromagnetic radiation source 110 into the material 106 contained in the first crucible 103. This is because the metal melt 105 in the second crucible 102 substantially shields the material or the metal melt 106 in the first crucible from the electromagnetic radiation 115, which is basically configured to effect a heat input via induction 116 to the metal 105 in the second crucible. Since the penetration depth in the metal melt 116 is comparatively small the induction is substantially limited to regions at the surface.

The shielding is effective, because the second crucible 102 is spatially arranged in front of the first crucible 103, when viewed from the electromagnetic radiation source 110, and because the electromagnetic radiation 115, which effects the induction 116 is absorbed by the metal 105 in the second crucible 102.

As a consequence of the indirect heating via the heat transfer from the second crucible due to the heat coupling 112, the liquid state of the metal melt is maintained, wherein the metal evaporates from the melt, which is indicated in FIG. 1 by the numeral 117.

Optionally, both crucibles 103 and 102 can also be connected via a conduit 114, which allows for an exchange between the two melts or allows for a replenishment of evaporated melt in the first crucible. For this reason there may be provided a replenishment device (not shown) at the second crucible with regard to the material of the melt.

The metal vapour, or the metal gas 109, respectively, is according to this embodiment either collected and carried in a transport conduit 111 by a carrier gas 108 in order to be supplied further to a desired use, and/or it is transported in vacuum as a particle beam (without transport conduit 111).

Figure 2:
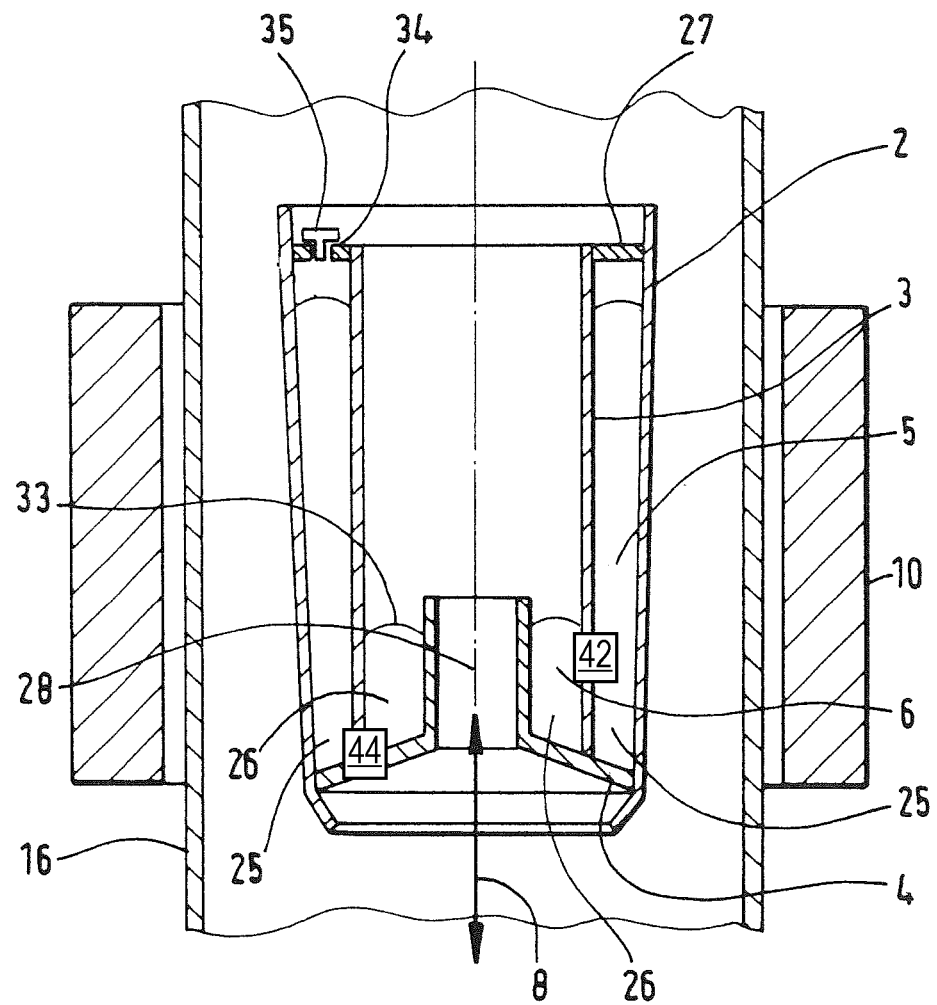
FIG. 2 schematically shows a second embodiment of a device for evaporating a metal melt.

Reference is now made to FIG. 2, which schematically shows in a cross-sectional view a second embodiment of a device for evaporating a metal from a melt, wherein the evaporated species is transported in the gaseous phase by a suitable process gas flow. The materials provided herein for the melts 5, 6 may correspond to those of the first embodiment.

The device is positioned in a quartz glass reactor 16, which is connected with a vacuum system (not shown), which can be adjusted with respect to a defined working pressure between, for example, 1 and 1.000 mbar. Embodiments of the invention are, however, not at all limited to such pressure regimes and higher pressures are possible as well.

The device comprises a concentrically arranged cylindrical double chamber crucible system in vertical arrangement having a first crucible portion 26 and a second crucible portion 25. The second crucible portion 25 encloses the first crucible portion 26 like a cylinder shell and substantially shields it towards outside. The first crucible portion 26 encloses a channel 28, which extends substantially along a symmetry axis of the device, which is vertical according to this specific example. The first crucible portion 26 is connected with the channel 28 via an aperture in order to deliver the evaporated material. In this example the aperture comprises a ring-like region of the first crucible portion 26 open towards the top direction. The apertures may of course also be directed laterally. Moreover, the diameter of the apertures can also be configured to be externally controllable.

The first inner crucible portion 26 is formed in this embodiment by the wall of a funnel-shaped element 4, which is open towards the bottom direction, and by an inner wall 3 of the second outer crucible portion 25. The crucible may again be made of a thermally and chemically resistant material such as, for example, pBN or other suitable materials.

The first crucible portion 26 contains the metal melt 6 to be evaporated. By a suitable replenishment device, for example a capillary tube (not shown in FIG. 2) evaporated material may be replenished in rigid (for example a powder) or in liquid form. The replenishment may according to a specific modification be carried out in a controlled manner, wherein for example by a weight sensor the weight of the illustrated double chamber crucible system is monitored (not shown in FIG. 2).

The second crucible portion 25 is formed by the crucible element 3 (inner wall), by the widened part of the reversed funnel-shaped element 4 (bottom) and by an outer crucible 2 (outer wall). A wall 3 common to the first and second crucible portions 25, 26 may comprise openings (not illustrated) in order to allow for a material exchange between the two crucible portions. The openings may be formed in a bottom portion of the crucible or of the crucible portion in the manner of a siphon, wherein in this case the melt surfaces in both crucibles attain the same level.

In the second crucible portion 25, the same or a similar metal melt (susceptor 5, for example a similar relatively low-temperature melting metal) as in the inner crucible portion 26 is inserted. The second crucible portion 25 is closed in its upper portion by a lid 27 in order to impede evaporative loss of the material. For replenishment and measurement purposes, a bore 34 is provided in the lid, the bore being locked, for example, by a screw 35.

In the region of the double chamber crucible system 25, 26 an electromagnetic radiation source 10 in the form of a high frequency coil is arranged outside the quartz glass reactor. The coil (electromagnetic radiation source 10) generates a radiation tuned to the metal melt of the outer crucible portion 25 such that the same can be heated by induction. The metal melt in the outer crucible portion 26 thereby acts as a susceptor 5 for the electromagnetic radiation.

The thickness of the susceptor, i.e., the inner distance between the crucible elements 2 and 3 of the outer crucible portion is larger than the penetration depth of the electromagnetic radiation of the high frequency coil (electromagnetic radiation source 10). Because of that it can be ensured that the metal melt 6 in the inner crucible portion 26 is not or only negligible affected by the radiation of the coil.

The melt 6 in the inner crucible portion 26 is rather heated by heat transfer from the second crucible portion 25 via the wall of the crucible element 3. Due to the substantially concentric arrangement of the crucible portions, the boundary surface between the crucible portions 25, 26 is relatively large in relation to its volume content, which further promotes an efficient heat transfer.

For an assimilation of the temperatures in the metal melts 5 and 6 the crucible material of the crucible element 3 has to enable a heat transfer, which is the case, for example, when a suitable material like pBN is used. Embodiments of the invention are, however, not limited to this material selection.

The temperature in the metal melt (susceptor material 5) and/or in the metal melt 6 can be determined by thermal elements (not shown in FIG. 2), which according to a modification of the embodiment may form a closed loop control in conjunction with the electromagnetic radiation source 10 in order to maintain the melt at a desired temperature.

With this structure, sputtering or the formation of droplets at the surface of a melt, are substantially limited to the outer closed crucible portion 25. Further, the metal melt in the inner crucible portion 26 may substantially stably and substantially homogenously evaporate without a formation of droplets, which is a substantial requisite for an improved quality of the following processes.

With this structure, the susceptor 5 can be dropped as a substantial source of contamination in the system, enabling improved quality of the following processes.

The carrier gas 8 passes through the central channel 28, which is bounded by the crucible element 4 of the inner crucible. The carrier gas 8 serves for an adjustment of the total pressure in the reactor 16 as well as for the transport and the dilution of the metal species in the gaseous phase evaporated from the melt repository 33 of the inner crucible portion 26.

The carrier gas 8 can be an arbitrary inert gas such as, for example, argon, hydrogen, nitrogen or suitable mixtures of inert gases. Depending on the flow direction of the carrier gas towards the top or bottom direction, the metal species, which have been evaporated, are transported towards the top or bottom direction out of the region of the crucible system. The possible flow directions of the carrier gas 8 are schematically depicted in FIG. 2 by the double arrow.

Besides the total pressure in the reactor, the flow of the carrier gas 8 represents a further substantial parameter for the flexible adjustment of the transport rate and transport direction of the evaporated metal species in the system.

The funnel-shape of the crucible element 4 bounding the channel 28, allows in conjunction with a suitably selected, constant flow velocity, a substantially vortex-free carrier gas flow and thus a substantially stationary transport of the evaporated metal species with substantially constant transport rate, which again represents a substantial prerequisite for an improved quality of the following processes.

The device according to the second embodiment is, however, not limited to the precise geometry of the crucible element 4 schematically shown in FIG. 2. Other geometries are also possible as long as thereby the substantially laminar character of the gaseous flow 8 is maintained.

The device according to the second embodiment is further not limited to the use of a carrier gas. The evaporation of the metal melt in relatively high vacuum is also possible. However, in this situation the central channel 28 may be without a function.

Figure 3:
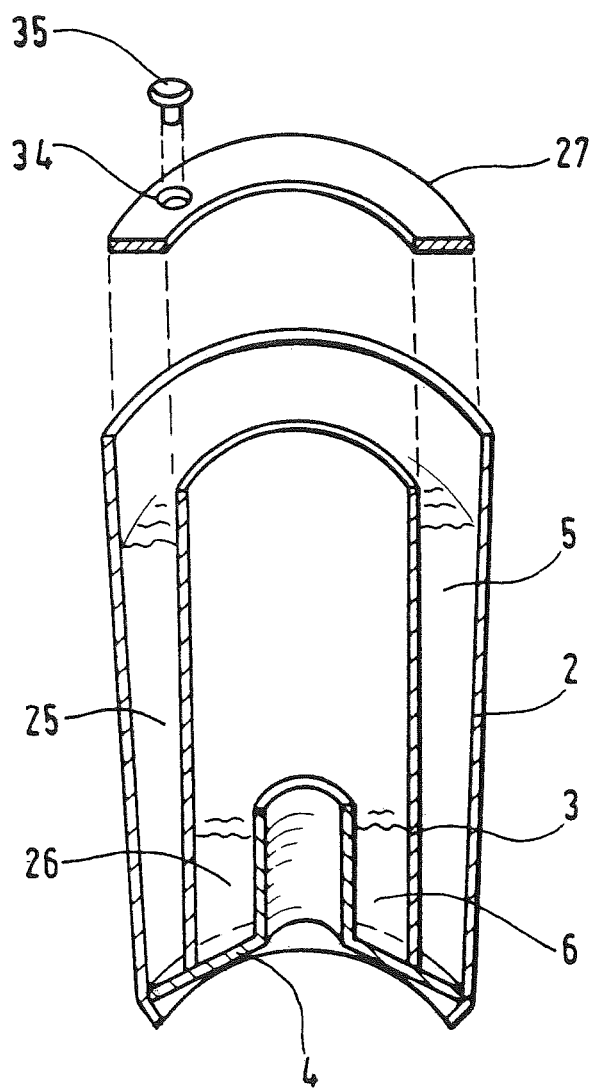
FIG. 3 schematically shows a perspective cross-sectional view of the device according to the second embodiment in FIG. 2.

FIG. 3 schematically shows a perspective view of the double chamber crucible system described above and schematically shown in cross-section in FIG. 2, for illustrating a substantially concentric arrangement of the crucible elements. The outer crucible portion 25 bounded by the crucible elements 2, 3, 4 as well as by the lid 27 having the bore 34 can be seen, whereby the crucible portion 25 containing the melt is used as the susceptor 5. The inner crucible portion 26 bounded by the crucible elements 3, 4, can further be seen including the metal melt 6 to be evaporated. The crucible element 4 further bounds the central channel 28 for the upwardly or downwardly directed flow of the carrier gas 8.

In operation of the device according to FIGS. 2, 3 the outer crucible portion 25 (susceptor 5) is at first filled with a suitable metallic material in the form of powder or as a granulate material. Thereafter, an electromagnetic radiation is generated by means of a high frequency coil (as the electromagnetic radiation source 10) using a frequency tuned to the material in the outer crucible portion 25, or using a correspondingly adapted frequency range. Due to the induced heat the material is heated above the melting point such that the molten susceptor 5 is formed. The heat, which arises in the outer crucible portion 25 is transferred via heat conduction and radiation towards the metal in the inner crucible portion 25. As a consequence this metal is also heated above the melting point and is provided as the melt 6. The metal melt 6 is partially evaporated, wherein the evaporation rate or the saturation partial pressure is defined after the temperature balance has been achieved between the crucible portions 25, 26 by the temperature of the susceptor melt.

The minimum temperature for operating the device is determined by the melting points of the materials (susceptor 5, metal melt 6). The maximum operation temperature is determined by the thermal stability of the crucible material and lies in the case when using pBN for example above 2000° C. Offset or substantially in parallel in time with regard to reaching the temperature balance in the device, the flow of a carrier gas 8 or of a carrier gas mixture having a defined mass flow, is generated from one or more external gas sources and is led upwards or downwards, respectively, through the central channel 28 of the device. The metal vapour of the melt 6 arising in the inner crucible portion 26 mixes through diffusion processes with the carrier gas or with the carrier gas mixture. Finally, the metal vapour of the melt 6 is transported either upwards or downwards out of the device substantially as a consequence of convection processes in dependence of the direction of the carrier gas 8 or carrier gas mixture flow, and is supplied to a further application. For the further application of coating or of material synthesis, a stationary transport of the metal vapour through the laminar carrier gas flow is significant. This can be achieved by a velocity of the carrier gas flow in the range of, for example, 1 cm/s up to 100 cm/s, at a total pressure in the reactor in the range of, for example, 1 mbar up to 1.000 mbar. Embodiments of the invention are in no way limited to such pressure regimes and higher pressures are possible as well.

Figure 4:
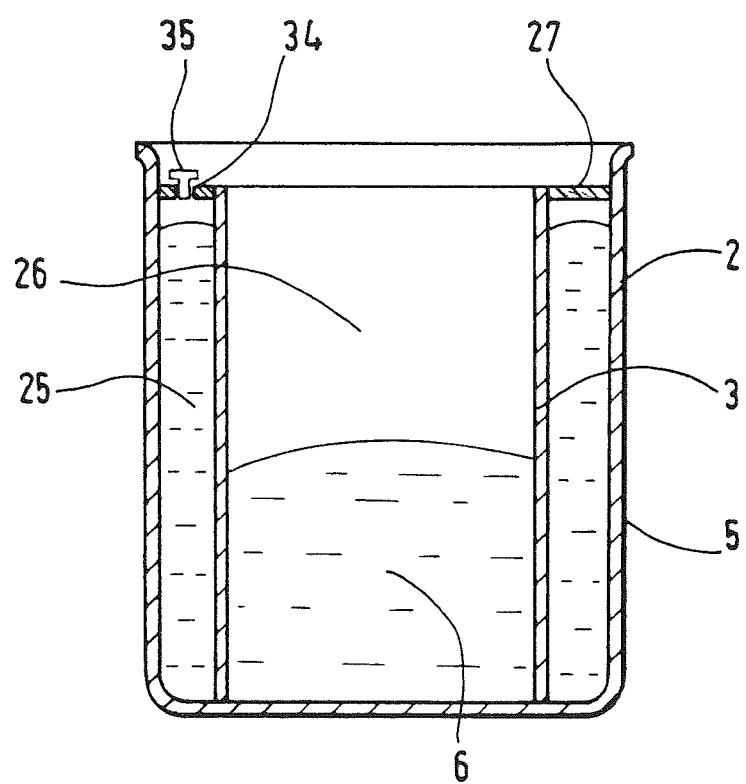
FIG. 4 schematically shows a third embodiment of a device for evaporating a metal melt.

Reference is made to FIG. 4, which schematically shows a cross-sectional view of a third embodiment of a device for evaporating a metal from a melt, including a transport of the evaporated species under relatively high vacuum conditions.

The device is positioned in a vacuum chamber made of, for example, stainless steel or another vacuum-resistant material (not shown), the vacuum chamber being connected with a vacuum system (not shown), due to pressure of less than, for example, $10^{-4}$ mbar can be adjusted.

The device comprises a substantially concentrically arranged cylindrical double chamber crucible system in substantially vertical arrangement, which analogously to the second embodiment (FIGS. 2, 3), comprises an outer crucible portion 26 including the melt 5 functioning as the susceptor and an inner crucible portion 25 including the metal melt 6 to be evaporated.

The outer crucible portion 26 is formed in this embodiment by a cylindrical crucible having a closed bottom 2, by a cylindrical crucible element 3, which is open at both ends and having a smaller diameter as the crucible 2, and by a circular lid element 27. For replenishment and measurement purposes the lid element includes a bore 34, which can be closed with a screw 35.

The inner crucible portion 25 is bounded by the inner crucible element 3 and by the bottom of the crucible element 2 in lateral and downward directions. The structure of the heater, i.e., the coil as an electromagnetic radiation source 10 (not shown in FIG. 4) corresponds to that arrangement which is schematically shown in FIG. 2, wherein here also the symmetry axis of the coil and the crucible or the crucible portions may be substantially identical. The process of heating of the crucible system up to the arrival at a defined partial pressure of the species evaporated from the metal melt 6 corresponds to the principles explained in detail with regard to the second embodiment (FIGS. 2, 3). Further, the same statements as made with regard to the second embodiment regarding the selection of materials (susceptor 5, melt 6) as well as for the crucible elements are without any limitation also applicable with regard to the third embodiment described herein.

However, different from the second embodiment (FIGS. 2, 3) a carrier gas flow in the process chamber is omitted. The crucible system does not include a central channel, but is bounded in downward direction by the bottom of the crucible element 2. The evaporated metal is transported under high vacuum conditions by the molecular flow out of the region of the evaporation source in upward direction and is supplied to a further application.

Figure 5:
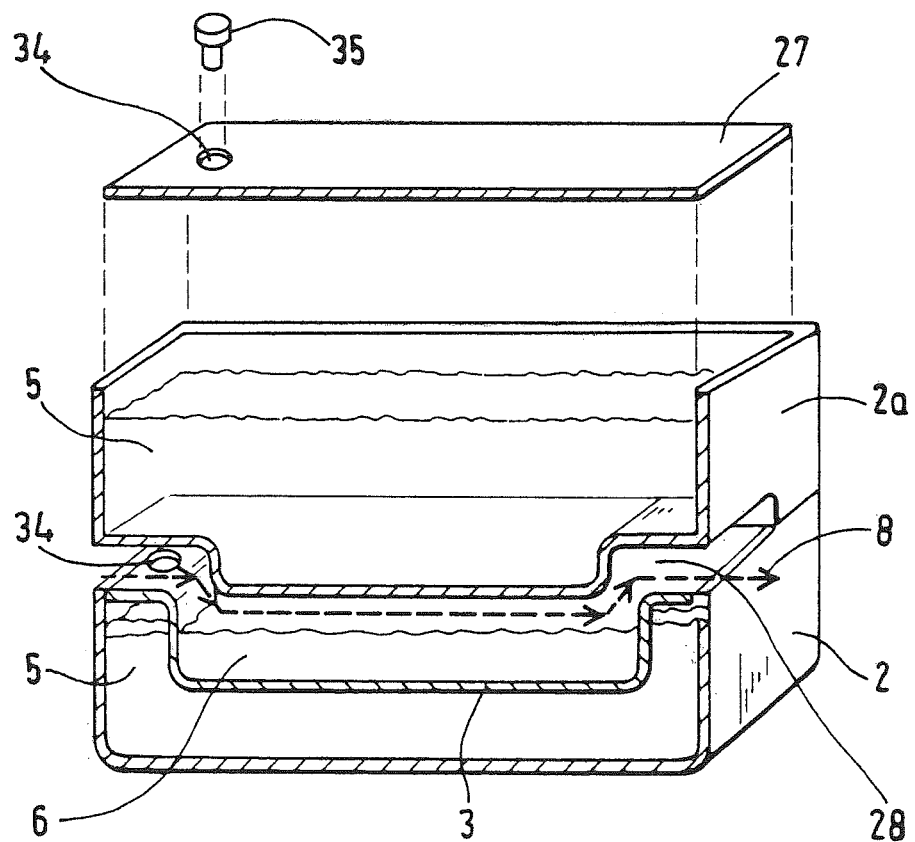
FIG. 5 schematically shows a fourth embodiment of a device for evaporating a metal melt.

Reference is made to FIG. 5, which schematically shows in a perspective view a fourth embodiment of a device for evaporating a metal from a melt in a horizontal arrangement. Those elements roughly corresponding to those schematically shown in the preceding embodiments are provided herein with the same reference numerals.

The device is positioned in a quartz glass reactor (not shown), which is connected with a vacuum system (not shown), by which, as in the second embodiment (FIG. 2, 3), a defined working pressure between 1 and 1.000 mbar can be adjusted. Embodiments of the invention are, however, in no way limited to such pressure regimes and higher pressures are possible as well.

The device comprises a horizontally arranged double chamber crucible system, which comprises an upper crucible portion and a lower crucible portion.

The upper crucible portion is formed in this embodiment by an upper container 2a having a substantially rectangular cross-section and a matching lid 27. The lower crucible portion is formed by a further container 2 having a substantially rectangular core section and a matching lid 3. The lid elements 3, 27 include openings 34 for replenishment purposes, which can be closed by screws 35. In the case of lid 27 of the upper container 2a, the openings 34 can also be used for a temperature measurement during the process.

In the bottom of the upper crucible container 2a an extended recess is formed, which comprises a main portion of the entire bottom area. In the lid element 3 of the lower crucible container 2 a further recess, being substantially conform with the recess in the bottom of the upper container, is formed.

The crucible containers 2, 2a serve for receiving the susceptor material 5. The metal to be evaporated (metal melt 6) is inserted into the recess of the lid element 3 of the lower crucible container 2.

At the opposite end faces of the upper crucible container 2a, substantially flat and substantially rectangular cut-outs are provided, such that in the arrangement of crucible elements according to FIG. 5 a substantially flat, and substantially horizontal channel 28 is formed having a substantially rectangular cross-section between the upper crucible container 2a and the lower crucible container 2.

The carrier gas 8 passes through the channel 28, which extends between the opposite end faces of the crucible system. Due to the substantially flat channel cross-section a large contact area between the carrier gas and the metal melt 6 to be evaporated, is achieved in conjunction with a simultaneously substantially laminar flow of the carrier gas 8, such that an efficient and stationary transport of the evaporated metal species is ensured.

As to the rest, the statements made with respect to the second embodiment (FIGS. 2, 3) are also applicable herein with respect to the carrier gases to be used, the pressure and flow conditions as well as the transport mechanisms in unlimited manner also for the fourth embodiment described herein. The high frequency coil as the electromagnetic radiation source 10 (not shown in FIG. 5) includes a (in the reference system of the figure) vertically extending symmetry axis as in the preceding embodiments. Alternatively, the symmetry axis can also substantially coincide with the dashed line in FIG. 5 indicating the flow of the carrier gas 8, i.e., the coil then encloses the not illustrated quartz glass container including the containers 2, 2a which is arranged therein in a substantially horizontally oriented manner in the figure and transverse to the viewing direction.

The device according to the fourth embodiment is, however, not limited to the specific geometry of the double chamber crucible system schematically shown in FIG. 5. Other container and channel geometries as well as optionally multiple channels are also possible, as long as thereby the substantially laminar character of the gas flow of the carrier gas 8 (or of the carrier gas mixture) is maintained.

The device according to the fourth embodiment is further not limited to the use of a carrier gas. The evaporation of the metal melt in high vacuum is possible as well.

The heating of the crucible system up to the arrival at a defined partial pressure of the species evaporated from the metal melt corresponds to the principles detailed with regard to the second embodiment (FIGS. 2, 3). Further, the statements made with regard to the selection of materials 5, 6 as well as for the crucible elements with respect to the second embodiment are also applicable in unlimited manner to the presently described fourth embodiment.

It should be understood that where the claims or specification refer to "a" or "an" element, such reference is not to be construed as there being only one of that element.

In the discussion unless otherwise stated, adjectives such as "substantially" and "about" modifying a condition or relationship characteristic of a feature or features of an embodiment, are understood to mean that the condition or characteristic is defined to within tolerances that are acceptable for operation of the embodiment for an application for which it is intended.

The invention claimed is:

1. A device for evaporating material from a melt, the device comprising:
   a first hollow-cylindrical crucible comprising a first side wall, a second side wall surrounding but not directly contacting the first side wall and comprising a first chamber shaped to hold a liquid between the first side wall and the second side wall;
   a second crucible surrounding and thermally coupled to the first hollow-cylindrical crucible as a cylindrical shell, the second crucible comprising the second side wall, a third side wall surrounding but not directly contacting the second side wall and comprising a second chamber shaped to hold a liquid between the second side wall and the third side wall;
   a reversed funnel-shaped element that opens towards a bottom direction, and is situated to serve as a bottom portion of the first hollow-cylindrical crucible and second crucible;
   an inner channel bounded by the first side wall; and
   a bottom opening of the inner channel bounded by the reversed funnel-shaped element,
   wherein the inner channel, the first hollow-cylindrical crucible, and the second crucible are concentrically arranged.

2. The device according to claim 1, comprising an electromagnetic radiation source surrounding the second crucible.

3. The device according to claim 1, further comprising:
   a susceptor material susceptible to being inductively heated by electromagnetic radiation in the chamber of the second crucible; and
   a metal melt in the chamber of the first hollow-cylindrical crucible.

4. The device according to claim 3, wherein the metal melt and the susceptor material include the same or a similar material.

5. The device according to claim 3, wherein the metal melt and the susceptor material are composed of material or a combination of at least two materials selected from a group consisting of: gallium, indium and aluminium.

6. The device according to claim 3, wherein the second side wall comprises an opening connecting the chamber of the first hollow-cylindrical crucible and the chamber of the second crucible.

7. The device according to claim 1 comprising a siphon between the chambers of the first hollow-cylindrical crucible and second crucible.

8. The device according to claim 1, wherein the second crucible is closed in its upper portion.

9. The device according to claim 1, wherein the first hollow-cylindrical crucible and second crucible are made from a dielectric material.

10. The device according to claim 1, wherein the first hollow-cylindrical crucible and/or the second crucible comprises pyrolytically deposited boron nitride.

11. A device for evaporating material from a melt, the device comprising:
    an inner channel defined by at least one side wall, a top opening and a bottom opening;
    a first crucible surrounding the channel and comprising a first chamber shaped to hold a liquid and defined by at least one side wall; and
    a second crucible surrounding and thermally coupled to the first crucible, the second crucible comprising a second chamber shaped to hold a liquid and defined by at least one side wall,
    a reversed funnel-shaped element that opens towards a bottom direction, and is situated to serve as a bottom portion of the first and second crucibles;
    wherein the second crucible surrounds the first crucible as a hollow cylinder shell which is closed in its upper portion, the channel extends entirely through the cylinder shell, and the bottom opening of the inner channel is bounded by the reversed funnel-shaped element.

12. The device according to claim 11, wherein the channel and the first crucible share a common side wall.

13. The device according to claim 11, wherein the first crucible and the second crucible share a common side wall.

14. The device according to claim 13, wherein the common side wall comprises an opening connecting the chamber of the first crucible and the chamber of the second crucible.

15. The device according to claim 11, comprising an electromagnetic radiation source surrounding the second crucible.

16. The device according to claim 11, comprising a siphon between the chambers of the first and second crucibles.

17. The device according to claim 11, wherein the first crucible and the second crucible are made from a dielectric material.

18. The device according to claim 11 further comprising a susceptor material susceptible to being inductively heated by electromagnetic radiation in the chamber of the second crucible and a metal melt in the chamber of the first crucible, wherein the second crucible is configured to receive the susceptor material such that the susceptor material shields the first crucible from an electromagnetic radiation source configured to heat the susceptor material.

19. The device according to claim 18, wherein the metal melt and the susceptor material are composed of material or a combination of at least two materials selected from a group consisting of: gallium, indium and aluminium.

20. The device according to claim 11, wherein the first crucible and/or the second crucible comprises pyrolytically deposited boron nitride.

* * * * *